United States Patent [19]
Moslehi

[11] Patent Number: 6,048,782
[45] Date of Patent: *Apr. 11, 2000

[54] METHOD FOR DOPED SHALLOW JUNCTION FORMATION USING DIRECT GAS-PHASE DOPING

[75] Inventor: Mehrdad M. Moslehi, Los Altos, Calif.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/720,892

[22] Filed: Oct. 4, 1996

Related U.S. Application Data

[62] Division of application No. 08/283,979, Aug. 1, 1994, Pat. No. 5,999,735.

[51] Int. Cl.[7] .............................. H01L 21/22; H01L 21/38
[52] U.S. Cl. ........................... 438/565; 438/530; 438/918
[58] Field of Search ................................... 437/165, 166, 437/168, 950; 148/DIG. 40; 438/565, 530, 542, 914, 918

[56] References Cited

U.S. PATENT DOCUMENTS

| | | | |
|---|---|---|---|
| 3,532,565 | 10/1970 | Cook | 437/165 |
| 3,602,778 | 8/1971 | Ura et al. | 317/234 |
| 3,762,966 | 10/1973 | Engeler et al. | 148/175 |
| 3,836,999 | 9/1974 | Nishizawa | 357/63 |
| 4,004,954 | 1/1977 | Tshudy et al. | 148/174 |
| 4,441,973 | 4/1984 | Noguchi | 204/192 |
| 4,504,331 | 3/1985 | Kuech et al. | 148/175 |
| 4,600,801 | 7/1986 | Guha et al. | 136/249 |
| 4,618,381 | 10/1986 | Sato et al. | 148/189 |
| 4,830,982 | 5/1989 | Dentai et al. | 437/94 |
| 4,877,753 | 10/1989 | Freeman | 437/959 |
| 4,904,616 | 2/1990 | Bohling et al. | 437/81 |
| 4,914,043 | 4/1990 | Nishizawa et al. | 437/2 |
| 4,927,786 | 5/1990 | Nishida | 437/233 |
| 4,939,103 | 7/1990 | Szolgyemy | 437/165 |

(List continued on next page.)

FOREIGN PATENT DOCUMENTS

| | | | |
|---|---|---|---|
| 58-071620 | 4/1983 | Japan | 437/165 |
| 63-166219 | 7/1988 | Japan . | |

OTHER PUBLICATIONS

C. M. Ransom, T. N. Jackson, J. F. DeGelormo, C. Zeller, D.E. Kotecki, C. Graimann, D.K. Sadana and J. Benedict, "Shallow n[+] Junctions in Silicon By Arsenic Gas–Phase Doping", J. Electrochem. Soc., vol. 141, No. 5, p. 1378–1381, (1994).

J. Nishizawa, K. Aoki and T. Akamine, "Ultrashallow, High Doping of Boron Using Molecular Layer Doping", Appl. Phys. Lett., vol. 56, No. 14, Apr. 2 1990, p. 1334–1335.

Yukihiro Kiyota, Tohru Nakamura, Taroh Inada, Atsushi Kuranouchi and Yasuaki Hirano, "Characteristics of Shallow Boron–Doped Layers in Si by Rapid Vapor Phase Direct Doping", J. Electrochem. Soc., vol. 140, No. 4, p. 1117–1121, (1993).

Mehrdad M. Moslehi, Cecil Davis and Allen Bowling, "Microelectronics Manufacturing Science and Technology: Single–Wafer Thermal Processing and Wafer Cleaning", TI Technical Journal, Sep.–Oct. 1992, p. 44–53.

*Primary Examiner*—Caridad Everhart
*Attorney, Agent, or Firm*—Wade James Brady, III; Frederick J. Telecky, Jr.

[57] ABSTRACT

Halides of a dopant species may be used as a dopant gas source to form shallow doped junctions using a direct gas-phase doping (GPD) process. These halides can also be combined with a carrier gas. Some advantages over conventional gas-phase doping processes include shallower junctions, shorter process times, lower processing temperature, and the elimination of a separate surface cleaning step for native oxide removal.

13 Claims, 2 Drawing Sheets

U.S. PATENT DOCUMENTS

| | | | |
|---|---|---|---|
| 4,988,640 | 1/1991 | Bohling et al. | 437/81 |
| 5,015,747 | 5/1991 | Hostalek et al. | 556/1 |
| 5,124,272 | 6/1992 | Saito et al. . | |
| 5,128,275 | 7/1992 | Takikawa et al. | 437/81 |
| 5,156,461 | 10/1992 | Moslehi et al. | 374/121 |
| 5,180,690 | 1/1993 | Czubatyj et al. | 437/165 |
| 5,242,859 | 9/1993 | Degelormo et al. | 437/165 |
| 5,275,966 | 1/1994 | Gedridge, Jr. | 437/81 |
| 5,293,216 | 3/1994 | Moslehi | 356/371 |
| 5,294,286 | 3/1994 | Nishizawa et al. | 156/610 |
| 5,300,185 | 4/1994 | Hori et al. | 158/610 |
| 5,332,689 | 7/1994 | Sandhu et al. | 437/168 |
| 5,338,697 | 8/1994 | Aoki et al. | 437/950 |
| 5,354,710 | 10/1994 | Kawagachi et al. . | |
| 5,387,545 | 2/1995 | Kiyoto et al. | 437/950 |

METHOD FOR DOPED SHALLOW JUNCTION FORMATION USING DIRECT GAS-PHASE DOPING

This is a division of application Ser. No. 08/283,979, filed Aug. 1, 1994 now U.S. Pat. No. 5,599,735.

FIELD OF THE INVENTION

This invention relates generally to the field of microelectronics and integrated circuits, and more particularly to a direct gas-phase doping (GPD) fabrication process for formation of shallow doped device junctions in semiconductor layers and substrates.

BACKGROUND OF THE INVENTION

Semiconductors are widely used in integrated circuits for electronic applications, including various information systems. Such integrated circuits typically use multiple bipolar junction transistors (BJT) and/or metal-oxide semiconductor field-effect transistors (MOSFET) fabricated in single crystal silicon. Many integrated circuits now require the introduction of dopants to one or more device junction layers for formation of the transistor device structures. Usually when dopants are introduced into a semiconductor wafer surface, they are introduced by a process called ion implantation, wherein the substrate is bombarded by ions of a certain species, thus introducing the dopant.

A significant requirement in sub-half-micrometer, high-performance semiconductor technologies is junction depth reduction (e.g., CMOS source/drain, bipolar emitter, and base) to suppress MOS punch-through leakage and to minimize device short-channel effects. Device junctions with relatively high surface dopant concentrations, ultra-shallow depths (below 1000 Å), low contact and sheet resistances, and low junction leakage currents will be critical for advanced sub-quarter-micrometer semiconductor technologies.

One problem with the ion implantation process is that the semiconductor crystal structure is damaged and later, a high temperature thermal anneal process must be performed in order to remove the defects. Another problem is that there is a limit on the shallowness of the doped junctions. In order to achieve junctions with depths on the order of 1000 Å or less, alternative device doping methods must be utilized.

Alternative methods of doping include direct gas-phase doping (GPD) such as rapid thermal gas-phase doping (RTGPD) and plasma immersion ion implantation (PIII), which allow the formation of ultra-shallow junctions without the use of conventional ion implantation. Prior art GPD processes usually have employed an ambient consisting of diborane mixed with hydrogen ($B_2H_6/H_2$) for p-type doping, to form ultra-shallow boron junctions; or phosphine mixed with hydrogen ($PH_3/H_2$) for n-type doping, to form ultra-shallow phosphorus doped junctions. Moreover, both arsine ($AsH_3$) and tertiarybutylarsine (TBA) have been used in GPD processes to form shallow arsenic-doped junctions. The GPD processes rely on the chemisorption of the dopant species followed by thermally activated surface dissociation of the dopant species and solid-state diffusion to form the doped junction. The GPD process usually consists of a native oxide removal process step prior to the formation of an adsorbed dopant layer on the silicon surface and subsequent solid-phase diffusion of dopants from the adsorbed layer into the silicon substrate. Dopants are incorporated into silicon by diffusion in an oxygen-free atmosphere at a relatively low temperature unlike the conventional diffusion process in which dopant diffusion is performed in an oxygen-rich ambient.

The GPD process involves species such as hydrogen, phosphine, diborane, or arsine. The dopant molecules are adsorbed on the semiconductor surface. After surface adsorption, dissociation occurs; the chemical bonds between hydrogen and the dopant atoms break, reducing the adsorbed molecules into arsenic, phosphorous, or boron atoms, which diffuse into the silicon substrate. The byproducts, e.g. hydrogen, then desorb from the surface to make the surface sites available for chemical adsorption of more dopant species.

Reduced junction depths are required in scaled-down semiconductor technologies. For instance, the source/drain junction depth must be reduced with each new IC technology generation. In general, the need for reduced junction depth is driven by the device scale-down and improved device performance. Conventional doping methods have shortcomings: the ion implantation processes and current GPD processes have limitations in terms of minimum junction depth and junction quality.

Ion implantation technology has been widely used in semiconductor device manufacturing because of its superior controllability and relatively high manufacturing throughput, but it is inadequate for junctions shallower than 1000 Å because of ion channeling at low ion energies, end-of-range implant damage, lateral dopant spreading, and poor throughput and process control at low implant energies (e.g. below 10 keV). Another limitation of the implantation-formed junctions is the so-called anomalous transient-enhanced boron diffusion during low-temperature thermal annealing caused by the thermal dissolution of small defect clusters produced by ion implantation. Moreover, ion implantation is not suitable for uniform doping of high-aspect-ratio trenches. Effective removal of the implantation-induced defects in Si requires relatively high thermal annealing temperatures, which further redistribute the dopant.

The GPD processes to date have been exclusively based on the $B_2H_6/H_2$ (for p type), $PH_3/H_2$ (for n type), and $AsH_3/H_2$ (for n type) chemistries. These processes do not produce any damage in silicon and are the most effective when the semiconductor surface is treated using an in-situ clean to remove any native oxide layer.

SUMMARY OF THE INVENTION

The present invention encompasses using a halide of a dopant species for GPD (gas-phase doping). These halides of a dopant species may also be combined with a carrier gas.

One embodiment is a gas-phase doping method for semiconductor wafers, comprising the steps of exposing the surface of a semiconductor wafer to a process medium in order to dope at least a portion of the surface of the wafer, where the process medium comprising a dopant gas, and the dopant gas comprises a halide of a dopant species.

Another embodiment comprises the steps of exposing the surface of a semiconductor wafer to a dopant gas in order to dope at least a portion of the surface of the wafer, wherein the dopant gas comprises a halide of a dopant species, and exposing the wafer and the dopant gas to a plasma source.

Yet another embodiment comprises the steps of exposing the surface of a semiconductor wafer to a dopant gas in order to dope at least a portion of the surface of the wafer, wherein the dopant gas comprises a halide of a dopant species, exposing the wafer and the dopant gas to a plasma source, and heating the wafer to provide solid-state dopant diffusion.

Some advantages of the invention are the ability to increase the dopant introduction rate into exposed silicon regions, resulting in an increased process throughput rate, and the ability to reduce the temperature of the GPD process and/or make the junction even shallower for a given desired surface concentration. With this invention, the junction depth can be reduced, yet still be heavily doped. Another advantage is increased junction surface dopant concentrations. Yet another advantage is the self-cleaning action of the GPD process ambient due to the presence of halogen atoms which may keep the silicon surface free of native oxide.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including schematic representations and manufacturing methods. Corresponding numerals and symbols in the different figures refer to corresponding parts unless otherwise indicated. Table 1 below provides an overview of the elements of the embodiments and the drawings.

TABLE 1

| Drawing Element | Generic Term | Specific Examples or Alternates |
|---|---|---|
| 10 | Semiconductor device | Metal-Oxide Field-Effect Transistor or MOSFET |
| 12 | Field oxide | |
| 14 | Polysilicon gate | |
| 16 | Sidewall spacer | Oxide sidewall spacer |
| 18 | Substrate | Silicon substrate |
| 20 | $p^+$ portion of substrate | |
| 22 | Gate dielectric | Gate oxide |
| 38 | Semiconductor wafer | |
| 50 | Single-wafer rapid thermal processing (RTP) reactor | Automated Vacuum Processor (AVP) |

TABLE 1-continued

| Drawing Element | Generic Term | Specific Examples or Alternates |
|---|---|---|
| 52 | Gas Distribution Network | Gas Distribution Network with 2 gas Manifolds; a non-plasma and a plasma manifold |
| 54 | Gas line | Nonplasma gas line |
| 56 | Reactor casing | |
| 58 | Chamber wall | Process chamber wall |
| 60 | Pin support plate | |
| 62 | Gas Injector | |
| 64 | Plasma line | |
| 66 | Connection | |
| 68 | Microwave discharge cavity | |
| 70 | Plasma tube | Quartz tube |
| 72 | Process chamber | |
| 74 | Plasma output | |
| 76 | Quartz jacket assembly | |
| 78 | Low thermal mass pins | |
| 80 | Optical quartz window | |
| 84 | Multi-zone illuminator assembly | Tungsten-halogen lamp assembly; lamp |
| 86 | Vacuum pump connection | |
| 88 | Pumping package | |
| 90 | Isolation gate | |
| 92 | Vacuum load-lock chamber | |
| 94 | Vertically moveable bellows | Up/down actuator mechanism |
| 96 | Cassette | |
| 98 | Wafer handling robot | |
| 100 | Vacuum pump connection | |
| 102 | Scatter sensor | Fiber-optic scatter sensor |
| 104 | Process control computer | |
| 106 | Temperature controller | Multi-zone Controller |
| 108 | Lamp power supply module | Multi-zone illuminator assembly power supply |
| 110 | Signal lines | Temperature sensor signals |

Figure 1:
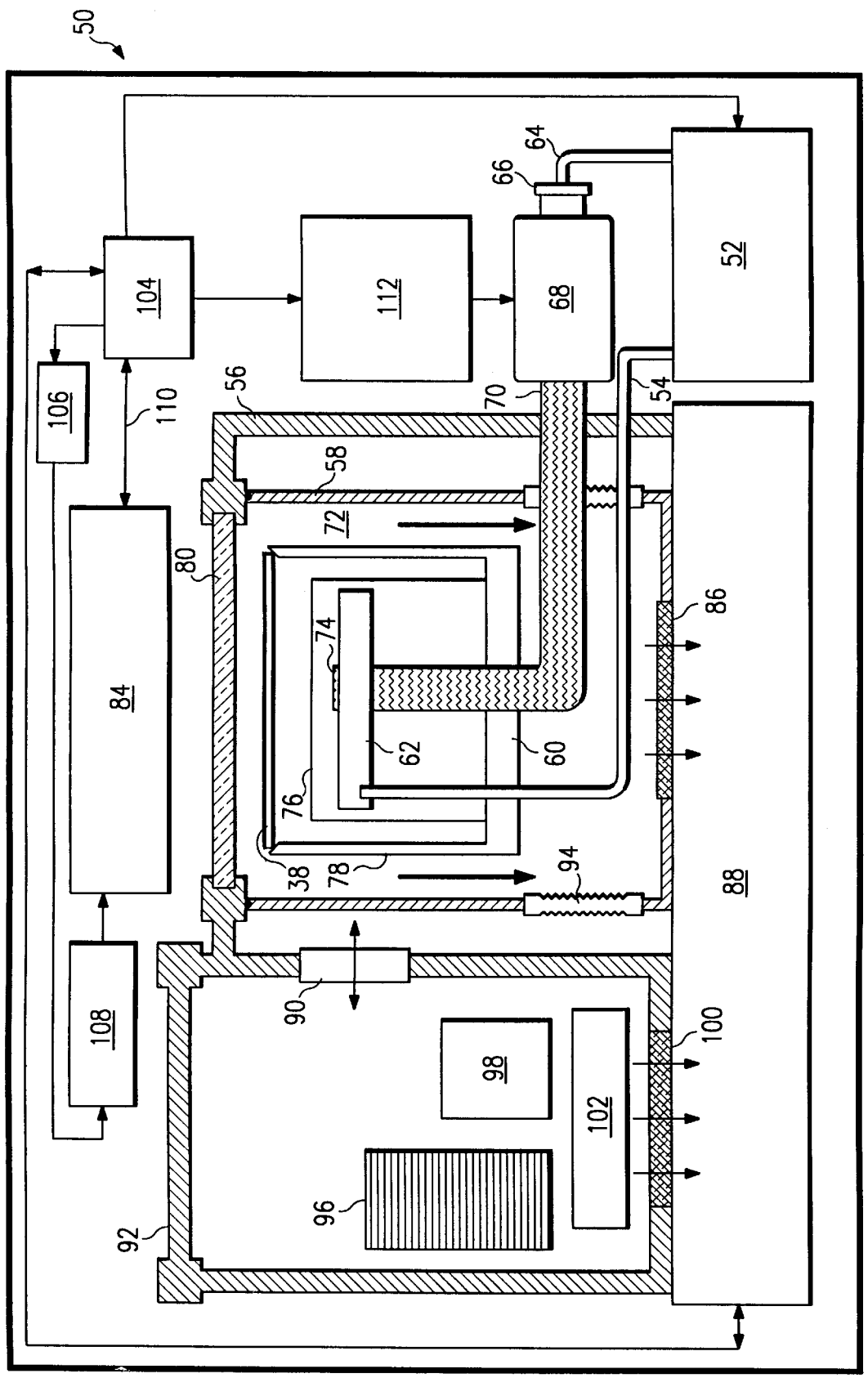
FIG. 1 is a schematic representation of a typical environment of the preferred embodiment: a single-wafer semiconductor fabrication reactor, such as a rapid thermal processing (RTP) reactor.

FIG. 1 shows an example of a Rapid Thermal Processing (RTP) reactor in which the present GPD process can be utilized, which establishes a typical environment of the present invention. Referring to FIG. 1, within a single-wafer RTP reactor 50 such as an Automated Vacuum Processor (AVP), may reside semiconductor wafer 38. Beginning at the bottom right-hand corner of FIG. 1, gas distribution network 52 may comprise two gas manifolds: a non-plasma process gas manifold and a plasma manifold. The gas distribution network 52 contains and distributes the gases discussed in this invention. The non-plasma gas manifold feeds through gas line 54 into reactor casing 56 and process chamber wall 58 to pin support plate 60 and into gas injector 62. The plasma manifold connects through plasma line 64 through connection 66 and into microwave discharge cavity 68. Plasma from microwave discharge cavity 68 feeds through plasma tube 70 which also penetrates reactor casing 56 and process chamber wall 58. Within the process chamber 72, plasma tube 70 passes through pin support plate 60 and through gas injector 62 to plasma output 74. Above quartz jacket assembly 76 and supported by low thermal mass pins 78 appears semiconductor wafer 38. Low thermal mass pins 78 hold semiconductor wafer 38 within process chamber 72.

Process chamber 72 includes optical quartz window 80 through which wafer heating is performed by the multi-zone illuminator assembly 84. In association with tungsten-halogen heating lamp module 84 may be a multi-point temperature sensor (not shown) as described in U.S. Pat. No. 5,156,461 (TI-15188) by Moslehi, et al issued on Oct. 20, 1992 and assigned to Texas Instruments Incorporated. Vacuum pump connection 86 removes flowing process gas and plasma from process chamber 72 and directs them into pumping package 88. Additionally, isolation gate 90 permits passage of semiconductor wafer 38 from vacuum load-lock chamber 92 into process chamber 72. To permit movement of semiconductor wafer 38 into process chamber 72, a vertically moveable bellows or up/down actuator mechanism 94 supports process chamber wall 58.

Within vacuum load-lock chamber 92 appears cassette 96 of semiconductor wafers 38 from which wafer handling robot 98 removes a single semiconductor wafer 38 for processing. To maintain load-lock chamber 92 under vacuum, load-lock chamber 92 also includes vacuum pump connection 100 to pumping package 88. Additionally, scatter sensor 102 may be included in load-lock chamber 92 for determining the surface roughness and reflectance of semiconductor wafer 38 for wafer processing measurements according to U.S. Pat. No. 5,293,216 (TI-15198), Sensor for Semiconductor Device Manufacturing Process Control, issued Mar. 8, 1994.

Process control computer 104 receives the multi-point temperature sensor signals, checks the status of multi-zone illuminator 84 for diagnosis/prognosis purposes, and provides multiple temperature control signals to multi-zone controller 106 in response to temperature readings of multi-point sensors. The multi-zone controller 106 receives measured multi-point temperature sensor outputs as well as the desired wafer temperature set point (from process control computer 104) and delivers suitable power set points to the multizone illuminator assembly power supply 108. Signal lines 110 between process control computer 104 and multi-zone illuminator assembly 84 include signals from multi-point temperature sensors from real-time semiconductor wafer 38 temperature measurements and lamp power readings.

GPD is the most effective when the silicon surface is initially treated using an in-situ cleaning process to remove any native oxide. It is important to make sure the surface is atomically clean, so that there is no residual native oxide to block the gas-phase doping process. The GPD rate at a given temperature is mostly limited by the processes of surface dissociation and desorption of the hydrogen byproducts from the surface to make more sites available for chemisorption of the dopant species.

The present invention, a method for doped shallow junction formation using direct gas-phase doping, involves halides of various dopant species. Table 2 shows a partial list of several halides of arsenic, phosphorus and boron dopants along with their physical properties. These dopant sources may be combined with a carrier gas, for example, $H_2$. The surface chemisorption, surface dissociation, and solid-state diffusion cycles may be performed in sequential thermal (or thermal and plasma) steps to optimize the overall GPD process. The use of a halide dopant source along with $H_2$ carrier gas (with or without $H_2$ remote plasma exposure cycles used during the surface dissociation cycles) will enhance the surface dissociation rate as well as the byproduct desorption rate (the latter via reaction of atomic hydrogen with the halogen species such as [Cl] or [F]), because chlorine, fluorine or bromine atoms react easily with hydrogen atoms, for example, to form HCl, HF, or HBr byproduct species.

TABLE 2

Dopant Halides and Their Physical Properties

| HALIDE | MELTING POINT (° C.) | BOILING POINT (° C.) |
|---|---|---|
| $AsBr_3$ (arsenic tribromide) | 32.8 | 221 |
| $AsCl_3$ (arsenic trichloride) | −8.5 | 130.2 |
| $AsF_5$ (arsenic pentafluoride) | −80 | −53 |
| $BCl_3$ (boron trichloride) | −107.3 | 12.5 |
| $PBr_3$ (phosphorus tribromide) | −40 | 172.9 |
| $PCl_3$ (phosphorus trichloride) | −112 | 75.5 |
| $PCl_2F_3$ | −8 | 10 |
| $PF_5$ (phosphorus pentafluoride) | −83 | −75 |
| $PF_3$ (phosphorus trifluoride) | −151.5 | −101.5 |

The choice of the type of dopant halide source depends on the application and various practical considerations. Only the halides in gas-phase (delivery by mass-flow controllers) and liquid-phase (delivery by liquid-source delivery system) forms are acceptable for use with thermal processing reactors. In particular, halides such as $BCl_3$, $AsF_5$, $PF_3$, $PF_5$, $PCl_2F_3$ are suitable sources since they are in the gas form at room temperature. The liquid-phase halides such as $PCl_3$ are also useful since they can provide sufficient vapor pressure of the halide source when the liquid source is heated. With a halide source used for GPD, one potential problem is the possibility of excessive Si etching during the GPD process. This problem can be avoided by addition of a small amount of $SiCl_4$ (with dopant chlorides), $SiF_4$ (with dopant fluorides) or another Si etch stop gas.

Figure 2:
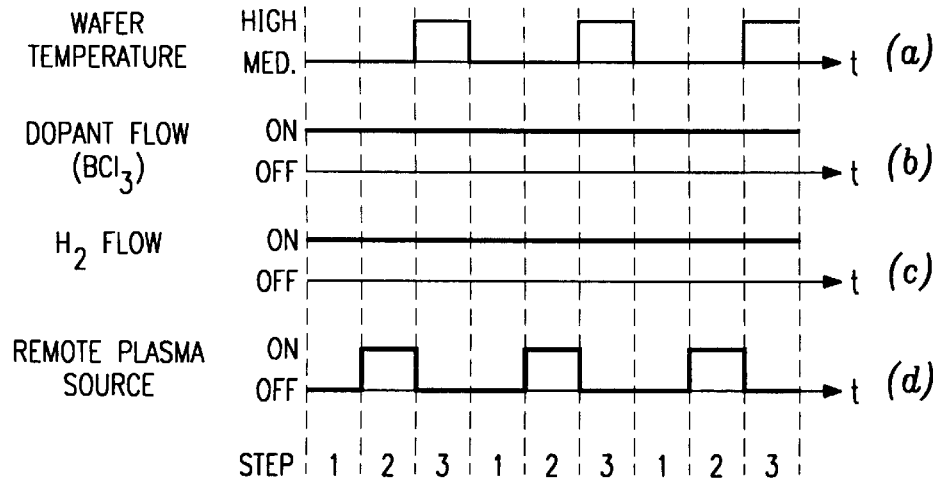
FIG. 2 is a timing diagram for a preferred embodiment of the invention, showing a GPD process with the following parameters: temperature, the dopant source flow rate, the hydrogen carrier flow rate and a remote $H_2$ plasma source.
Figure 4:
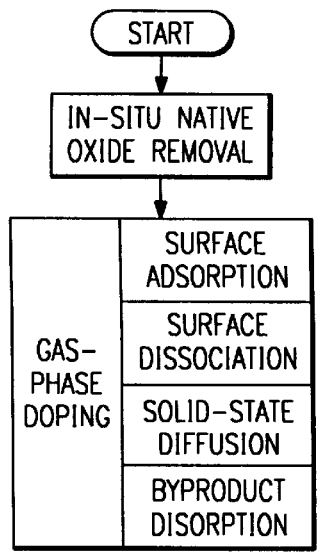
FIG. 4 is a flow diagram depicting the process steps of the invention.

A timing diagram for a preferred embodiment of a GPD process using remote $H_2$ plasma and halide source is shown in FIG. 2. The sequential process shown in FIG. 4 is performed after an in-situ clean in order to remove native oxides (although the use of a halide, especially a fluoride, dopant source can eliminate the need for a separate in-situ clean or native oxide removal step). FIG. 2 shows the wafer temperature, the dopant source (such as $BCl_3$) flow rate, hydrogen carrier flow rate, and a remote hydrogen plasma source state (e.g. a source of microwave discharge that injects hydrogen plasma into the chamber). Each doping is a three-step process, with the steps described below:

Step 1) A low-to-medium temperature dopant chemisorption step, where the wafer temperature is at a medium setting, the dopant flow is on, the hydrogen flow is on, but the remote plasma source is off.

Step 2) A low-to-medium temperature surface dissociation and desorption of byproduct step with an option of remote plasma excitation for $H_2$ carrier gas, where the wafer temperature is medium, the dopant flow is on, the hydrogen flow is on, and the remote hydrogen plasma source is on. The reaction results in some chemisorption of dopant species on the available sites on the surface; and Step 3) A higher temperature solid-state diffusion step to drive the dopant atoms into silicon to form the doped junction.

These 3-step cycles may be repeated as many times as desired, in order to obtain higher doping concentration or deeper junctions.

The novel use of a halide as a dopant species for use with GPD chemistries offers some advantages over the conventional GPD processes based on $B_2H_6/H_2$, $PH_3/H_2$, or $AsH_3$ chemistries. The dopant introduction rate into exposed silicon regions is increased, resulting in an increased throughput rate. The temperature of the process may be reduced, making the junction even shallower for a given surface concentration. Although the junction depth may be reduced, it may still be heavily doped with this invention. In addition, when using the halides, it is possible to eliminate a cleaning step, due to the surface cleaning action of the halogen species.

The above processes can be done with purely thermal doping, or with a combination of thermal and plasma; such as the addition of hydrogen plasma. The sequential multi-processing GPD process based on the combination of thermal and plasma process energy sources to enhance the chemisorption, surface dissociation, and byproduct desorption processes is also novel and offers potentially significant advantages over the conventional methods of GPD.

Figure 3:
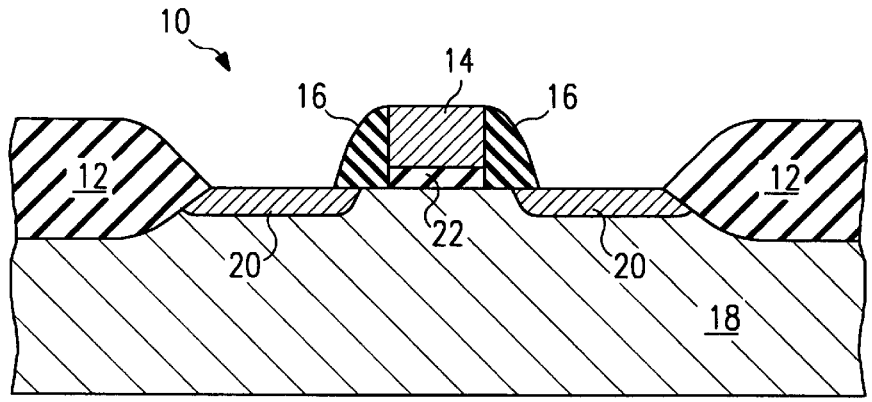
FIG. 3 is a cross-sectional view of a semiconductor device upon which this process could be used.

FIG. 3 is an example of a structure that benefits from the invention. The substrate 18 is exposed to one of the halide gases in the invention, doping it and forming, for example, the p+ source/drain junction region 20.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications

What is claimed is:

1. A direct gas-phase doping method for semiconductor wafers, comprising the steps of:

providing a semiconductor wafer having a surface;

exposing said surface of said wafer to a dopant gas and directly doping at least a portion of said surface of said wafer with said dopant gas, wherein said dopant gas comprises a halide of a dopant species, wherein said halide is a material selected from the group consisting of $AsBr_3$, $AsF_5$, $PBr_3$, $PCl_2F_3$, $PF_5$, and $PF_3$; and exposing said wafer and said dopant gas to a plasma source.

2. The method of claim 1 wherein said plasma source is hydrogen.

3. The method of claim 1 wherein said halide of a dopant species is combined with a carrier gas.

4. The method of claim 3 wherein said carrier gas is hydrogen.

5. A direct gas-phase doping method for semiconductor wafers, comprising the steps of:

providing a semiconductor wafer having a surface;

exposing said surface of said wafer to a dopant gas and directly doping at least a portion of said surface of said wafer with said dopant gas, wherein said dopant gas comprises a halide of a dopant species, wherein said halide is a material selected from the group consisting of $AsBr_3$, $AsF_5$, $PBr_3$, $PCl_2F_3$, $PF_5$, and $PF_3$;

exposing said wafer and said dopant gas to a plasma source; and heating said wafer to provide solid-state dopant diffusion.

6. The method of claim 5 wherein the temperature of said heating t step is a higher temperature than the temperature of said exposing step.

7. The method of claim 5 wherein said plasma source provides hydrogen plasma.

8. The method of claim 5 wherein said halide of a dopant species is combined with a carrier gas.

9. The method of claim 8 wherein said carrier gas is hydrogen.

10. A direct gas-phase doping method for semiconductor wafers, comprising the steps of:

providing a semiconductor wafer having a surface, said wafer comprising silicon; and exposing said surface of said wafer to a process gas and directly doping at least a portion of said surface of said wafer with said dopant gas, said process gas comprising a dopant gas and an etch suppressing additive, wherein said dopant gas comprises a halide of a dopant species, and wherein said etch suppressing additive is a material selected from the group consisting of silicon tetrachloride, silicon tetrafluoride, and dichlorosilane.

11. The method of claim 10 wherein said dopant species is a material selected from the group consisting of boron, phosphorous, arsenic, antimony, aluminum, gallium, indium, and bismuth.

12. The method of claim 10 wherein said halide is a material selected from the group consisting of chlorine, fluorine and bromine.

13. The method of claim 12 wherein said halide of a dopant species is a material selected from the group consisting of $AsBr_3$, $AsCl_3$, $AsF_5$, $BCl_3$, $PBr_3$, $PCl_3$, $PCl_2F_3$, $PF_5$, and $PF_3$.

* * * * *